(12) United States Patent
Aude et al.

(10) Patent No.: US 10,608,650 B2
(45) Date of Patent: Mar. 31, 2020

(54) VOLTAGE-CONTROLLED OSCILLATORS WITH RAMPED VOLTAGES

(71) Applicant: TEXAS INSTRUMENTS INCORPORATED, Dallas, TX (US)

(72) Inventors: Arlo James Aude, Lawrenceville, GA (US); Soumya Chandramouli, Atlanta, GA (US); Roland Nii Ofei Ribeiro, San Jose, CA (US); Abishek Manian, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/002,881

(22) Filed: Jun. 7, 2018

(65) Prior Publication Data
US 2019/0379384 A1 Dec. 12, 2019

(51) Int. Cl.
*H03B 5/04* (2006.01)
*H03B 5/12* (2006.01)
(Continued)

(52) U.S. Cl.
CPC .............. *H03L 7/099* (2013.01); *H02M 3/07* (2013.01); *H03B 5/04* (2013.01); *H03B 5/1212* (2013.01);
(Continued)

(58) Field of Classification Search
CPC ...... H03B 5/04; H03B 5/1206; H03B 5/1212; H03B 5/1215; H03B 5/1228; H03B 5/124; H03B 5/1246; H03B 5/1253; H03B 5/1265; H03B 2200/005; H03B 2201/011; H03B 2201/018; H03B 2201/0208;
(Continued)

(56) References Cited

U.S. PATENT DOCUMENTS 5,379,002 A * 1/1995 Jokura ...................... H03L 7/14
331/10
6,239,665 B1 * 5/2001 Strom ................... H03B 5/1228
331/117 FE
(Continued)

OTHER PUBLICATIONS

International Search Report for corresponding PCT Patent Application No. PCT/US2019/035929, dated Sep. 26, 2019 (2 pages).

*Primary Examiner* — Levi Gannon
(74) *Attorney, Agent, or Firm* — John R. Pessetto; Charles A. Brill; Frank D. Cimino (57) ABSTRACT

In examples, a voltage-controlled oscillator (VCO) comprises an inductor; a first pair of transistors having first terminals coupled to a voltage source, second terminals coupled to opposing ends of the inductor, and control terminals coupled to opposing ends of the inductor; and a second pair of transistors having first terminals coupled to ground, second terminals coupled to opposing ends of the inductor, and control terminals coupled to opposing ends of the inductor. The VCO also comprises a first transistor coupled to at least one capacitor, the combination of the first transistor and the at least one capacitor coupled to the inductor in parallel. The VCO further comprises second, third, and fourth transistors coupled to a control terminal of the first transistor, the second transistor coupled to the voltage source, the fourth transistor coupled to ground, and the third transistor configured to receive a ramped voltage.

12 Claims, 6 Drawing Sheets

(51) Int. Cl.
*H03L 1/02* (2006.01)
*H03L 7/099* (2006.01)
*H02M 3/07* (2006.01)

(52) U.S. Cl.
CPC ......... *H03B 5/1228* (2013.01); *H03B 5/1265* (2013.01); *H03L 1/02* (2013.01); *H03B 2200/005* (2013.01); *H03B 2201/0266* (2013.01)

(58) Field of Classification Search
CPC ...... H03B 2201/025; H03B 2201/0266; H03B 2201/0283; H03B 2201/0291; H03L 1/02; H03L 7/099; H03L 7/146
See application file for complete search history.

(56) References Cited

U.S. PATENT DOCUMENTS

| | | | |
|---|---|---|---|
| 6,445,257 B1 | 9/2002 | Cox et al. | |
| 6,753,738 B1 * | 6/2004 | Baird | H03L 7/093 331/117 FE |
| 7,084,713 B2 * | 8/2006 | Peluso | H03B 5/1228 331/179 |
| 7,221,234 B2 * | 5/2007 | Chien | H03L 7/099 331/117 FE |
| 7,230,504 B1 * | 6/2007 | Marques | H03B 5/1228 331/117 FE |
| 8,044,741 B2 * | 10/2011 | Barton | H03L 7/0991 331/117 FE |
| 9,356,557 B1 * | 5/2016 | Gao | H03L 3/00 |
| 2005/0068086 A1 * | 3/2005 | Yeh | H03K 3/013 327/337 |
| 2005/0231295 A1 | 10/2005 | Maeda | |
| 2007/0247237 A1 * | 10/2007 | Mohammadi | H03B 5/1228 331/360 |
| 2008/0068097 A1 | 3/2008 | Sung | |
| 2008/0174379 A1 * | 7/2008 | Chen | H03B 5/1228 331/177 V |
| 2010/0007427 A1 * | 1/2010 | Tomita | H03B 5/04 331/117 FE |
| 2016/0112006 A1 * | 4/2016 | Rajendran | H03B 5/1228 331/117 FE |

* cited by examiner

VOLTAGE-CONTROLLED OSCILLATORS WITH RAMPED VOLTAGES

BACKGROUND

None.

SUMMARY

In examples, a voltage-controlled oscillator (VCO) comprises an inductor; a first pair of transistors having first terminals coupled to a voltage source, second terminals coupled to opposing ends of the inductor, and control terminals coupled to opposing ends of the inductor; and a second pair of transistors having first terminals coupled to ground, second terminals coupled to opposing ends of the inductor, and control terminals coupled to opposing ends of the inductor. The VCO also comprises a first transistor coupled to at least one capacitor, the combination of the first transistor and the at least one capacitor coupled to the inductor in parallel. The VCO further comprises second, third, and fourth transistors coupled to a control terminal of the first transistor, the second transistor coupled to the voltage source, the fourth transistor coupled to ground, and the third transistor configured to receive a ramped voltage.

In examples, a phase locked loop (PLL) system comprises a phase-frequency detector (PFD); a charge pump coupled to the PFD; first and second comparators, each of the first and second comparators having inputs coupled to an output of the charge pump and configured to receive first and second reference voltages, respectively; a digital controller coupled to outputs of the first and second comparators; and a voltage-controlled oscillator (VCO) coupled to the output of the charge pump. The VCO includes an inductor; a first pair of transistors coupled to a voltage source and to the inductor; a second pair of transistors coupled to ground and to the inductor; a first transistor coupled to a capacitor, the combination of the first transistor and the capacitor coupled in parallel with the inductor, the first transistor having a control terminal; second, third, and fourth transistors coupled to the control terminal of the first transistor, the second and fourth transistors coupled to the voltage source and to ground, respectively, and the third transistor coupled to an output of the digital controller, the second, third, and fourth transistors also coupled to outputs of the digital controller; and a coarse capacitor bank coupled to the inductor in parallel.

In examples, a method comprises operating a phase locked loop (PLL) voltage-controlled oscillator (VCO); detecting that a voltage output by a charge pump of the PLL exceeds a voltage threshold; and, in response to the detection: turning on a first transistor; turning off a second transistor after turning on the first transistor; and applying a ramped voltage to the first transistor after turning off the second transistor. Applying the ramped voltage to the first transistor causes a capacitance of the VCO to change. The method also comprises turning on a third transistor and turning off the first transistor after turning on the third transistor.

BRIEF DESCRIPTION OF THE DRAWINGS

For a detailed description of various examples, reference will now be made to the accompanying drawings in which.

DETAILED DESCRIPTION

Phase-locked loops (PLLs) and similar devices are commonly used in circuits in an attempt to ensure that the frequency and phase of an output signal stay locked with the frequency and phase of a reference signal. The frequency and/or phase of the output signal are susceptible to drift due to various factors, but the PLL maintains a lock with the reference signal, thereby preventing such drift.

One cause of frequency drift is ambient temperature variation. When the ambient temperature rises, the frequency of the PLL output signal tends to rise, and when the ambient temperature falls, the frequency of the PLL output signal tends to fall. This type of drift is normally corrected by the locking capabilities of the PLL. Specifically, the voltage that is input to a voltage-controlled oscillator (VCO) within the PLL is increased or decreased to adjust the frequency of the PLL output signal. In this way, the PLL compensates for the rise and fall of output signal frequency as a function of ambient temperature variation.

It is possible, however, for the ambient temperature to rise so high or to fall so low that the voltage input to the VCO saturates. When this happens, increasing or decreasing the voltage input to the VCO fails to adequately compensate for the ambient temperature. Thus, the PLL loses its lock, which is an undesirable situation.

Solutions to such problems are described herein. In examples, comparators are used to determine when the input voltage to the VCO saturates. When this occurs, further adjustments to the VCO input voltage will not cause a change in VCO oscillation frequency. However, the VCO oscillation frequency can still be manipulated by adjusting the capacitance of the VCO. Accordingly, when the input voltage to the VCO saturates, the capacitance of the VCO is dynamically adjusted to manipulate VCO oscillation frequency and to help maintain a lock with the frequency of the PLL reference signal. When capacitance is adjusted in this manner, the VCO input voltage is removed from saturation and can again be adjusted to help maintain lock. However, if the VCO input voltage subsequently saturates again, the capacitance is again dynamically adjusted, and the VCO input voltage is thereby again removed from saturation.

In examples, the VCO capacitance is adjusted by coupling and uncoupling capacitors in parallel with the oscillation inductor of the VCO. In examples, each such capacitor, or each set of such capacitors, is coupled to a transistor, and when the capacitor(s) are to be coupled or uncoupled from the oscillation inductor of the VCO, the transistor is gradually turned on or gradually turned off. In this way, the capacitance of the VCO does not change abruptly, thus mitigating the likelihood of sudden frequency changes and resultant loss of lock. Illustrative structures and methods for implementing such techniques, including the manner in which the transistor is gradually turned on and off, are now described in detail.

Figure 1A:
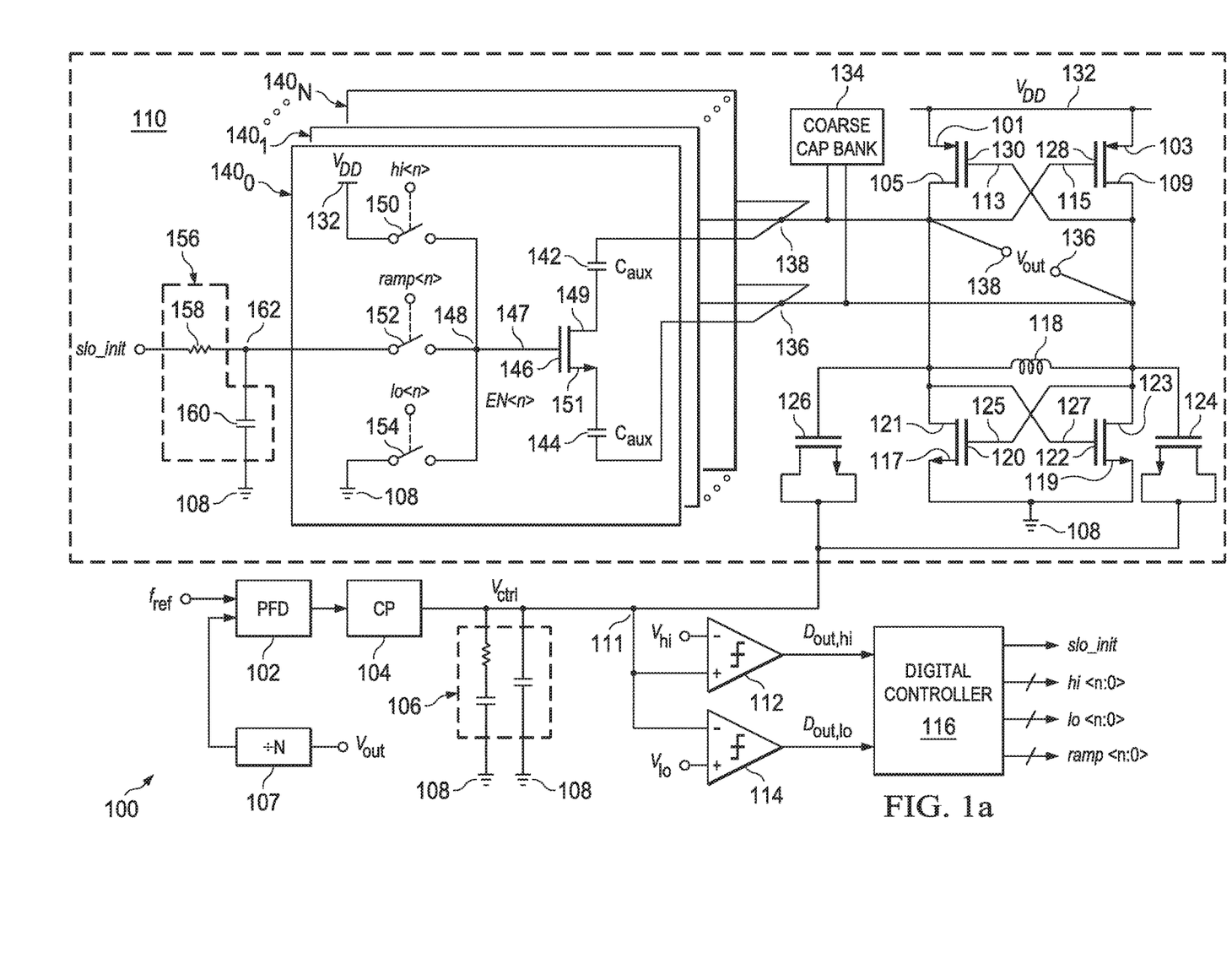
FIG. 1a is a circuit schematic diagram of an illustrative phase locked loop (PLL) system, in accordance with examples.

FIG. 1a is a circuit schematic diagram of an illustrative PLL system 100, in accordance with examples. The PLL system 100 comprises a phase-frequency detector (PFD) 102; a charge pump 104; smoothing circuitry 106 that includes any suitable combination of resistors and capacitors—for example, as specifically shown in FIG. 1a; ground 108; a VCO 110; comparators 112, 114; and a digital controller 116 (e.g., a processor executing code). The PFD 102 receives a reference signal $f_{ref}$ having a frequency and phase to which the PLL system 100 locks the output signal $V_{out}$ of the PLL system 100 (or, in examples like that shown in FIG. 1a, to which the PLL system 100 locks a divided version of $V_{out}$, as divided by divider 107). The non-inverting and inverting inputs to the comparators 112, 114 receive reference signals $V_{hi}$ and $V_{lo}$ (which are set as desired), respectively, and their other inputs couple to node 111 at the output of the charge pump 104, as shown. The digital controller 116 receives the output of comparator 112 ($D_{out,hi}$) and the output of comparator 114 ($D_{out,lo}$) and, based on these signals, produces multiple digital output signals: slo_init; hi<n:0>; lo<n:0>; and ramp<n:0>. At least some purposes of these signals are described below.

In examples, the VCO 110 comprises an oscillation inductor 118; a transistor 120 (e.g., n-type metal oxide semiconductor field effect transistor (MOSFET)); and a transistor 122 (e.g., n-type MOSFET). The gate terminal 125 (gate terminals are also referred to herein as "control terminals") of the transistor 120 couples to the drain terminal 123 of the transistor 122, and the gate terminal 127 of the transistor 122 couples to the drain terminal 121 of the transistor 120. The source terminals 117, 119 of the transistors 120, 122 couple to ground 108. The VCO 110 further includes a varactor 124 (e.g., n-channel) and a varactor 126 (e.g., n-channel). The varactors 124, 126 couple to node 111. The varactors 124, 126 also couple to the inductor 118, as do the drain terminals of the transistors 120, 122.

The VCO 110 further includes transistors 128 (e.g., p-type MOSFET) and 130 (e.g., p-type MOSFET). The transistor 128 has a gate terminal 115 coupling to the drain terminal 105 of the transistor 130, and the transistor 130 has a gate terminal 113 coupling to the drain terminal 109 of the transistor 128. The source terminals 103, 101 of the transistors 128, 130 couple to voltage source ($V_{DD}$) 132, and their drain terminals 109, 105 couple to $V_{out}$ nodes 136, 138, as shown. The nodes 136, 138 couple to the inductor 118 as shown. The $V_{out}$ formed across the nodes 136, 138 is fed back to the optional divider 107 or, in examples, directly to the PFD 102. Because $V_{out}$ is formed across multiple nodes 136, 138 and, in examples, the divider 107 has a single input terminal, a differential amplifier with unity gain is in some examples coupled between the divider 107 and the nodes 136, 138. In examples, the divider 107 has a differential input.

In examples, the VCO 110 additionally comprises a coarse capacitor bank 134, which couples to nodes 136, 138 in parallel to the inductor 118. The VCO 110 further comprises multiple sets of fine-tuning capacitor circuitry $140_0$, $140_1$, ..., $140_N$. Each set $140_{0...N}$ includes one or more capacitors and associated circuitry to facilitate the gradual increase and decrease in charge of the capacitors—for example, capacitors 142 and 144; a transistor 146 (e.g., n-type MOSFET) having drain and source terminals 149, 151 coupled to the capacitors 142, 144; a node 148 coupled to the gate terminal 147 of the transistor 146; and switches (e.g., transistors, such as n-type MOSFETs) 150, 152, and 154 coupled to the node 148. The switch 150 couples to $V_{DD}$ 132. The switch 154 couples to ground 108. The switch 152 couples to node 162. Node 162 couples to ramping circuitry 156, which, in examples, includes resistor 158 and capacitor 160 coupled as shown. The ramping circuitry 156 receives the slo_init output produced by the digital controller 116. The combination of the capacitors 142, 144 and transistor 146 for each set $140_{0...N}$ couples in parallel with the inductor 118 (e.g., to nodes 136, 138). Similarly, the ramping circuitry 156 couples to the switch 152 of each of the sets $140_{0...N}$, as shown. In examples, each of one or more of the sets $140_{0...N}$ includes only one capacitor (e.g., either capacitor 142 or 144, but not both).

The outputs of the digital controller 116 are digital signals. For example, the slo_init signal is a one-bit digital signal. In examples, the hi<n:0>, lo<n:0>, and ramp<n:0> signals are multi-bit digital signals, with the number of bits in each signal corresponding to the number N of sets 140. In examples, the slo_init signal is applied to each of the sets $140_{0...N}$, and in examples, one bit of each of the signals hi<n:0>, lo<n:0>, and ramp<n:0> is distributed to each of the sets $140_{0...N}$. For instance, in the set $140_0$, the switches 150, 152, and 154 are controlled by the output bits hi<0>, ramp<0>, and lo<0>, respectively. Likewise, in the set $140_1$, the transistors 150, 152, and 154 are controlled by the output bits hi<1>, ramp<1>, and lo<1>, respectively. Similarly, in the set $140_N$, the transistors 150, 152, and 154 are controlled by the output bits hi<n>, ramp<n>, and lo<n>, respectively. The slo_init output, which is applied to the ramping circuitry 156, couples to node 162, which couples to the transistor 152 of each of the sets $140_{0...N}$. For simplicity's sake, the remainder of this discussion describes manipulation of the transistors in the set $140_0$, but any combination of the transistors in the sets $140_{0...N}$ is available to dynamically manipulate the capacitance of the VCO 110.

In operation, the PFD 102 determines a difference in frequency and/or phase based on $f_{ref}$ and the output of divider 107. (In examples, the PFD 102 determines only a difference in phase, because locking the phase of $V_{out}$ to the phase of $f_{ref}$ inherently causes the frequencies to lock as well.) The output of the PFD 102 indicates this difference and is provided to the charge pump 104. The charge pump 104, in turn, outputs a voltage signal $V_{ctrl}$ to node 111. This voltage signal controls the frequency at which the VCO 110 oscillates. The same voltage signal is provided to the comparators 112, 114. The outputs of the comparators 112, 114 remain zero (or "low") until the ambient temperature reaches such a level that $V_{ctrl}$ is not able to compensate (e.g., it saturates with respect to the VCO 110). In examples, the $V_{ctrl}$ and $V_{lo}$ reference voltages are selected so that the digital controller 116 takes remedial action to maintain the PLL lock before $V_{ctrl}$ saturates. In examples, the $V_{hi}$ and $V_{lo}$ reference voltages are selected so that the digital controller 116 takes corrective action after $V_{ctrl}$ saturates. In examples, the $V_{hi}$ reference voltage is the upper voltage threshold beyond which the digital controller 116 takes remedial action to help maintain PLL lock, and in examples, the $V_{lo}$ reference voltage is the lower voltage threshold beyond which the digital controller 116 takes remedial action to help maintain PLL lock. Changes in $V_{ctrl}$ are smoothed by the smoothing circuitry 106.

The $V_{ctrl}$ signal, which is present at node 111, is provided to the comparators 112, 114 to determine whether $V_{ctrl}$ exceeds either of the thresholds $V_{hi}$, $V_{lo}$. $V_{ctrl}$ is also provided to the VCO 110 to generate an oscillating $V_{out}$ signal based on the value of $V_{ctrl}$. The oscillation inductor 118, in tandem with the capacitors in the coarse capacitor bank 134 and in the set(s) $140_0 \ldots _N$, generates $V_{out}$, while the transistors 120, 122, 128, and 130 and $V_{DD}$ 132 and ground 108 continually provide current to the inductor 118 and the capacitors coupled to the inductor 118. The varactors 124, 126 are voltage-dependent capacitors whose capacitances (and, consequently, the frequency of the VCO) change based on $V_{ctrl}$. In examples, the coarse capacitor bank 134 is configured with a specific setting during design or manufacture of the PLL system 100. Thus, in examples, the coarse capacitor bank 134 is not dynamically manipulated during operation, although the scope of this disclosure is not limited in this manner.

When $V_{ctrl}$ is between $V_{hi}$ and $V_{lo}$, the operation described above continues, with $V_{ctrl}$ being continually adjusted to maintain PLL lock. However, when $V_{ctrl}$ exceeds $V_{hi}$ or $V_{lo}$, the digital controller 116 manipulates the circuitry in one or more of sets $140_0 \ldots _N$ to adjust the capacitance of the VCO 110, thereby adjusting the frequency of the VCO 110 beyond what would be possible by adjusting only $V_{ctrl}$. As described below, the switches 150, 152, 154 in the sets $140_0 \ldots _N$ are opened and closed in sequences that facilitate the gradual rise or fall of capacitance of the VCO 110, thus mitigating potential lock problems due to sudden changes in VCO frequency.

Figure 1B:
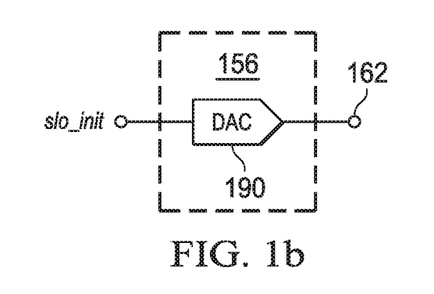
FIG. 1b is a schematic diagram of illustrative ramping circuitry, in accordance with examples.

Referring briefly to FIG. 1B, an alternative ramping circuitry 156 is shown comprising a digital-to-analog converter (DAC) 190. The input of the DAC 190 receives the slo_init signal (modified as described below), and the output of the DAC 190 couples to node 162.

Figure 2:
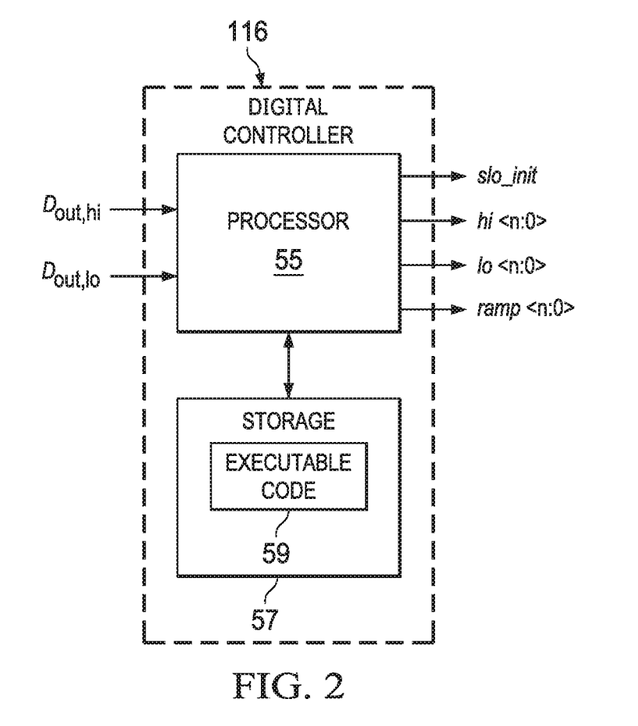
FIG. 2 is a block diagram of an illustrative digital controller, in accordance with examples.

FIG. 2 is a block diagram of an illustrative digital controller, in accordance with examples. The digital controller 116 comprises a processor 55 coupled to storage 57 (e.g., non-volatile memory). The storage 57 stores executable code 59. The processor 55, upon executing the executable code 59, performs some or all of the actions ascribed herein to the digital controller 116. The processor 55 performs its operations using $D_{out,hi}$ and $D_{out,lo}$ as inputs and providing slo_init, hi<n:0>, lo<n:0>, and ramp<n:0> as outputs.

Figure 3:
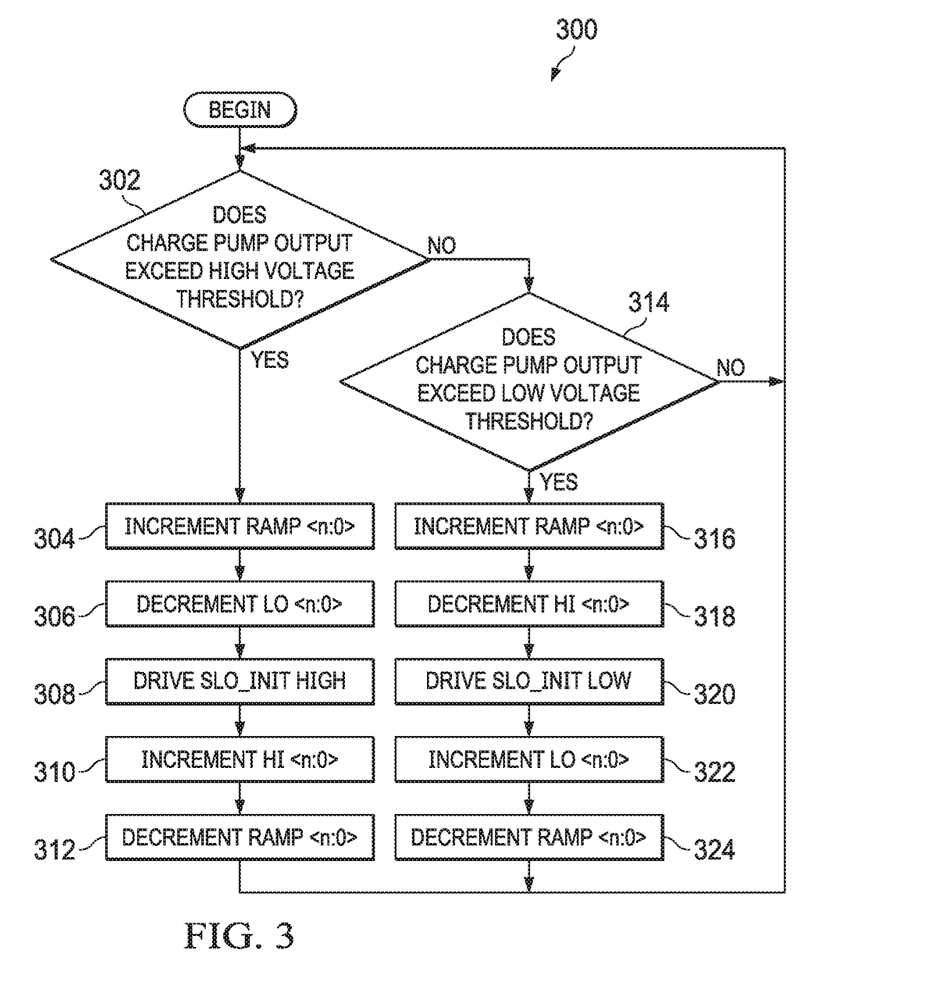
FIG. 3 is a flow diagram of an illustrative method of operation of the digital controller of FIG. 2, in accordance with examples.

The operation of the PLL system 100 when $V_{ctrl}$ exceeds $V_{hi}$ and $V_{lo}$ is now described with respect to FIGS. 1a and 3. As depicted in FIG. 3, a method 300—which is performed by the digital controller 116—begins by determining whether the charge pump output $V_{ctrl}$ exceeds the high voltage threshold $V_{hi}$ (step 302). If so, the digital controller 116 increments ramp<n:0> in step 304. For example, if n=7 and the default ramp signal is <00000000>, during step 304 the digital controller 116 increments the ramp signal so that the ramp signal becomes <00000001>. This causes the switch 152 of set $140_0$ to close because the switch 152 is controlled by ramp<0>. Next, the method 300 comprises decrementing lo<7:0> (step 306). For example, the lo signal transitions from <00000001> to <00000000> so that the switch 154 opens. At this stage, the node 148, which was previously coupled to ground 108 via switch 154, is now coupled to the ramping circuitry 156 via switch 152. The method 300 next comprises driving slo_init from low to high (step 308). Although the digital controller changes the state of slo_init from low to high substantially instantly, the ramping circuitry 156—in this example, the resistor 158 in tandem with the capacitor 160—causes a more gradual change in voltage to be seen at the switch 152. This gradual rise in voltage is applied to the gate terminal of the transistor 146, gradually turning on the transistor 146 and thus gradually increasing the capacitance of the VCO 110 using the capacitors 142, 144.

After the voltage at the gate terminal of the transistor 146 has reached the voltage of slo_init (e.g., after a predetermined amount of time), the method 300 comprises incrementing hi<n:0> (step 310). For example, if the default state of the hi signal is <00000000>, the digital controller 116 increments the hi signal to be <00000001>, which causes the switch 150 to close. The method 300 subsequently comprises decrementing ramp<n:0> (step 312), thus opening the switch 152. Thus, the effect of performing steps 304-312 is to close switch 152, open switch 154, drive the voltage at node 148 from low (e.g., ground) to high (e.g., slo_init), then close switch 150 and open switch 152, thus coupling the node 148 to a fixed high signal $V_{DD}$. In this way, the gate terminal of the transistor 146 receives a gradual rise in voltage from ground to $V_{DD}$, thus causing a gradual turning on of the transistor 146 and a gradual increase in capacitance of the VCO 110. In this way, sudden changes in frequency are mitigated and thus lock is maintained. After step 312 is complete, control of the method 300 returns to step 302.

If $V_{ctrl}$ does not exceed the high voltage threshold (step 302), the method 300 continues by determining whether $V_{ctrl}$ exceeds the low voltage threshold (meaning that $V_{ctrl}$ is lower than the low voltage threshold) (step 314). Stated another way, performing step 314 entails determining whether $V_{ctrl}$ is lower than the low voltage threshold. If not, control of the method 300 returns to step 302, but if so, the method 300 comprises performing step 316, in which ramp<n:0> is incremented. Incrementing ramp<n:0> causes the switch 152 to close. The method 300 then comprises decrementing hi<n:0> (step 318), which causes the switch 150 to open. The method 300 subsequently comprises driving slo_init from high to low (step 320). This causes the voltage at the gate terminal of the transistor 146 to gradually decrease, thus causing the transistor 146 to gradually turn off, which, in turn, gradually decreases the capacitance of the VCO 110 by reducing charge in the capacitors 142, 144. The method 300 next includes incrementing lo<n:0> (step 322), which closes the switch 154, and then decrementing ramp<n:0> (step 324), which opens the switch 152. In this way, the voltage applied at the gate terminal of the transistor 146 is gradually reduced, thus gradually reducing the capacitance of the VCO 110, avoiding sudden changes in oscillation frequency, and preserving PLL lock.

In some examples, it is possible that the remedial actions described in steps 304-312 (in the case of $V_{ctrl}$ exceeding the high voltage threshold) and in steps 316-324 (in the case of $V_{ctrl}$ exceeding the low voltage threshold) are insufficient to bring $V_{ctrl}$ back into a range between the voltage thresholds $V_{hi}$ and $V_{lo}$. In such instances, the method 300 will cause those remedial actions to be repeated, except with one or more additional sets in the sets $140_0 \ldots _N$. For example, if $V_{ctrl}$ exceeds $V_{hi}$ (step 302), the digital controller 116 performs the steps 304-312 in the context of set $140_0$. However, in this example, performing these steps increases the oscillation frequency of the VCO 110, but not enough to bring $V_{ctrl}$ below $V_{hi}$. Accordingly, the digital controller 116 performs the steps 304-312 in the context of set $140_1$. If this is still not adequate to bring $V_{ctrl}$ into the range between $V_{hi}$ and $V_{lo}$, the digital controller 116 performs the steps 304-312 yet again, this time in the context of set $140_2$, and so on until $V_{ctrl}$ is brought into the range between $V_{hi}$; and $V_{lo}$. The same iterative approach is performed with respect to steps 316-324 when $V_{ctrl}$ exceeds the low voltage threshold $V_{lo}$. Once $V_{ctrl}$ is brought into the range between $V_{hi}$ and $V_{lo}$, $V_{ctrl}$ is again usable to adjust the frequency of the VCO 110 to help maintain lock (until such time as $V_{ctrl}$ saturates, at which point the digital controller 116 again performs the remedial actions described in FIG. 3).

Figure 4:
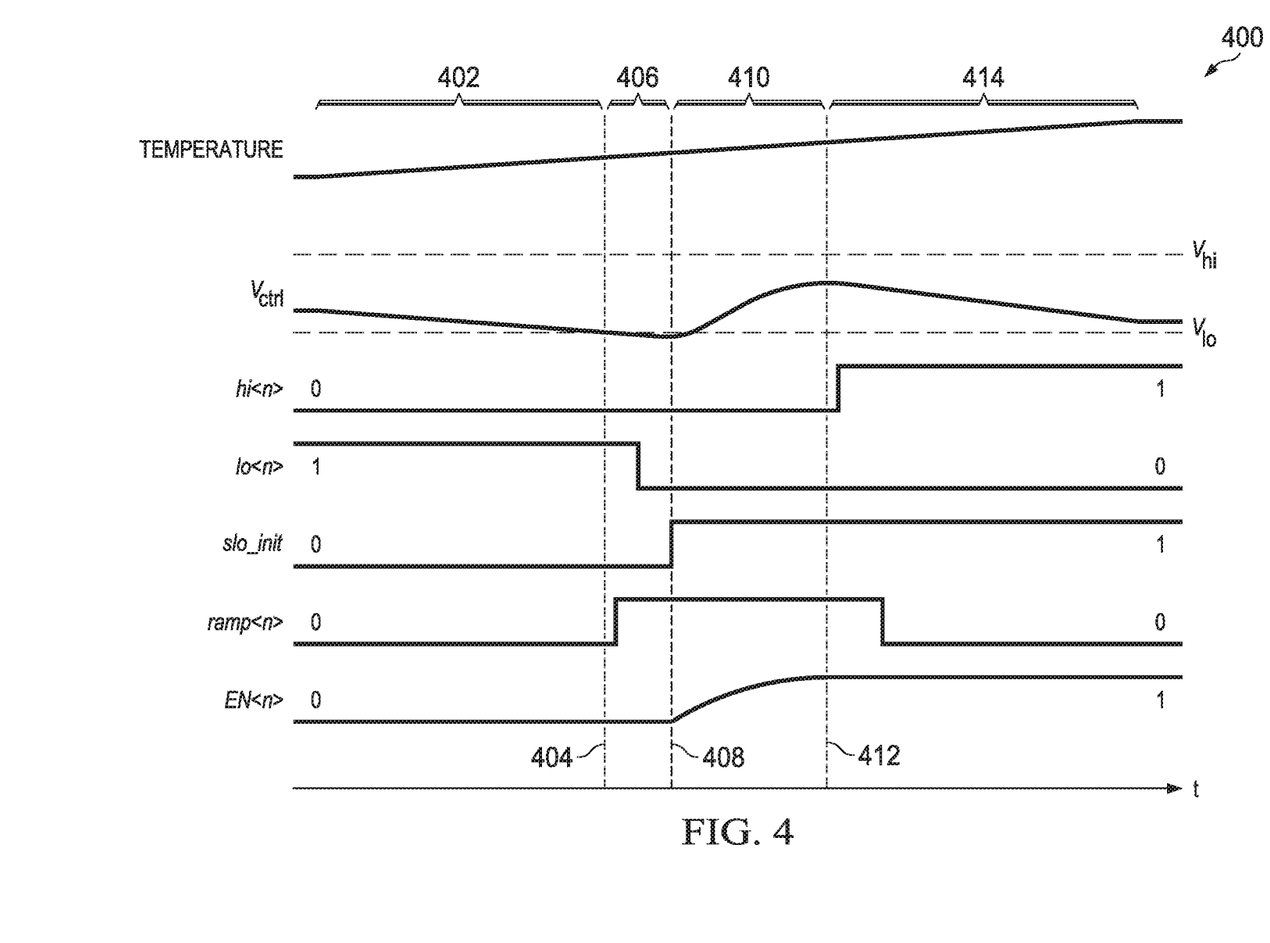
FIGS. 4 and 5 are timing diagrams describing illustrative operations of the PLL system of FIG. 1a, in accordance with examples.

FIG. 4 depicts an illustrative timing diagram 400 that describes the steps 304-312 of FIG. 3. Time is depicted on the x-axis and magnitude (voltage and temperature) is depicted on the y-axis. The first trace at the top of the diagram 400 depicts ambient temperature. The second trace depicts $V_{ctrl}$ relative to threshold voltages $V_{hi}$ and $V_{lo}$. The third through sixth traces are the signals hi, lo, slo_init, and ramp, respectively. The bottom trace is the voltage at the gate terminal of the transistor 146 (labeled EN<n> in FIG. 1a).

Referring to FIG. 4 and FIG. 1a in tandem, during a time period 402, the signals hi, lo, slo_init, ramp, and EN are low, high, low, low, and low, respectively, meaning that the switch 150 is open, switch 154 is closed, the voltage at node 162 is zero or substantially zero, the switch 152 is open, and the voltage at node 148 is zero or substantially zero. Also during time period 402, the ambient temperature begins rising. As a result, to maintain lock, the PLL system 100 adjusts $V_{ctrl}$ downward. Adjusting $V_{ctrl}$ downward compensates for the rise in temperature until time 404, at which point $V_{ctrl}$ exceeds $V_{lo}$. When this occurs, $V_{ctrl}$ can no longer compensate for the continued rise in temperature. Consequently, the capacitance of the VCO 110 in the PLL system 100 should be increased, as described in detail above. Thus, during time period 406, the ramp signal is incremented, causing switch 152 to close. The signal lo is decremented, causing switch 154 to open.

At time 408, the signal slo_init is incremented. The rise in the slo_init signal is smoothed by the ramping circuitry 156 and results in an EN signal that rises slowly, as shown during time period 410. The slow rise in EN causes the transistor 146 to slowly turn on which, in turn, causes the capacitance of the VCO 110 to rise slowly. The rise in capacitance of the VCO 110 causes the $V_{ctrl}$ signal to rise so that it is between $V_{hi}$ and $V_{lo}$, because the low $V_{ctrl}$ is no longer required to maintain lock. The duration of time period 410 is preprogrammed, for example, into the digital controller 116. In examples, the duration of time period 410 is such that the voltage at node 148 reaches $V_{DD}$. At time 412, the voltage at node 148 has reached $V_{DD}$. Accordingly, in time period 414, the signal hi is incremented, thus closing switch 150, and the signal ramp is decremented, thus causing the switch 152 to open.

Figure 5:
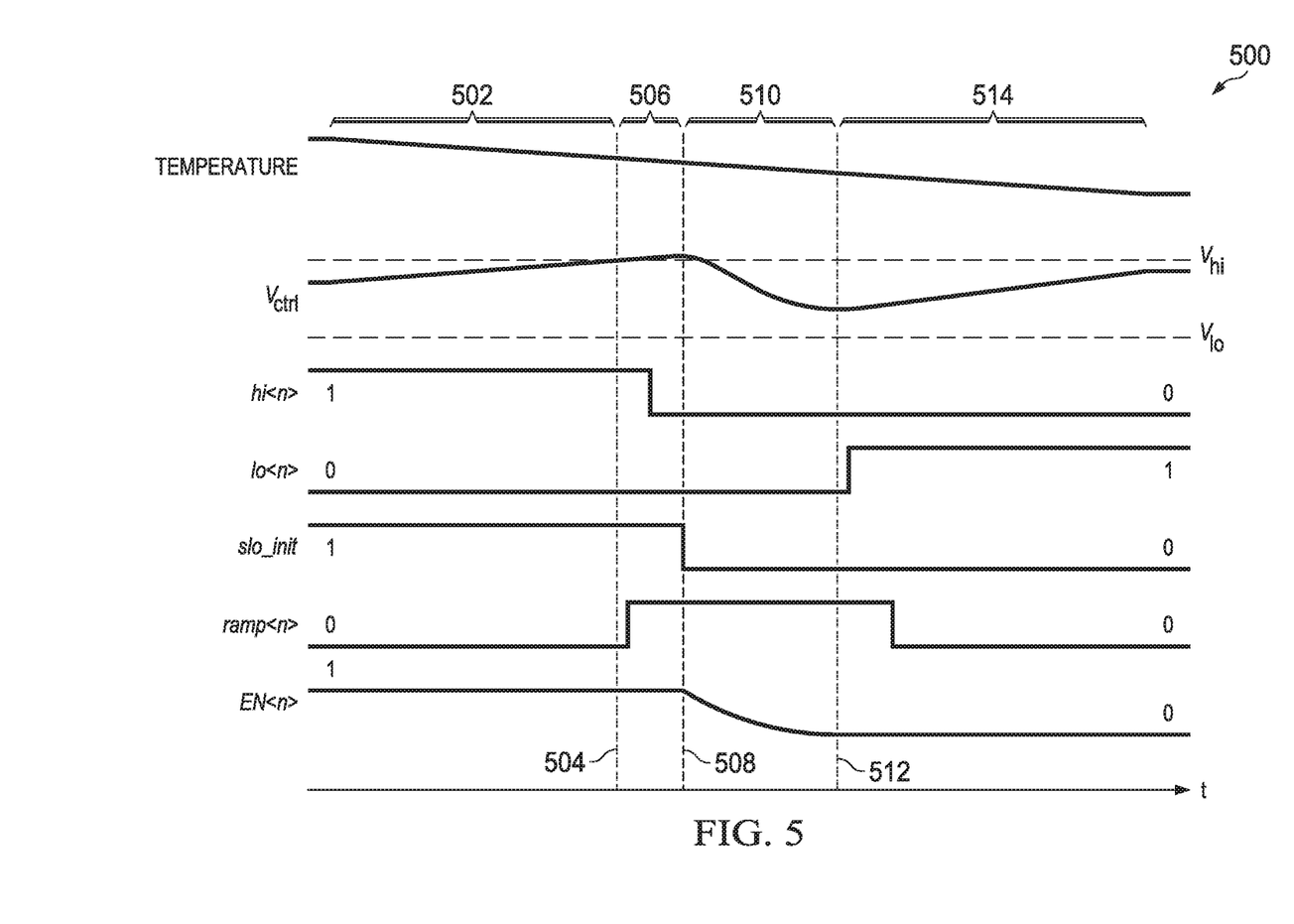

FIG. 5 depicts an illustrative timing diagram 500 that describes the steps 316-324 of FIG. 3. The x- and y-axes are similar to those in FIG. 4, as are the identities of the traces depicted in the diagram. During time period 502, the ambient temperature is falling, unlike in FIG. 4, in which the ambient temperature rises. To compensate for the fall in temperature, $V_{ctrl}$ rises until it saturates at time 504. During time period 506, the signal ramp is incremented, thus closing switch 152, and the signal hi is decremented, thus opening switch 150. At time 508, the signal slo_init is decremented, thus causing the voltage at node 148 to gradually fall, as depicted by EN during time period 510. This decreases the capacitance of the VCO 110, thus decreasing $V_{ctrl}$. At time 512, EN reaches zero or substantially zero, and during time period 514, the signal lo is incremented to cause switch 154 to close, and the signal ramp is decremented to cause the switch 152 to open.

As explained above and as depicted in FIG. 1b, in some examples, the ramping circuitry 156 comprises a DAC 190. In such examples, the DAC 190 receives a series of digital signals that result in an analog output that gradually rises or gradually falls. For example, the DAC 190 receives a multi-bit slo_init signal in lieu of the single-bit slo_init signal described above, with the number of bits in the multi-bit slo_init signal corresponding to the granularity of the slo_init signal and, thus, the smoothness of the resulting analog signal. In such examples, the resistor 158 and capacitor 160 are unnecessary. However, in some examples, the resistor 158 and capacitor 160 are still included to smooth the output of the DAC 190.

Figure 6:
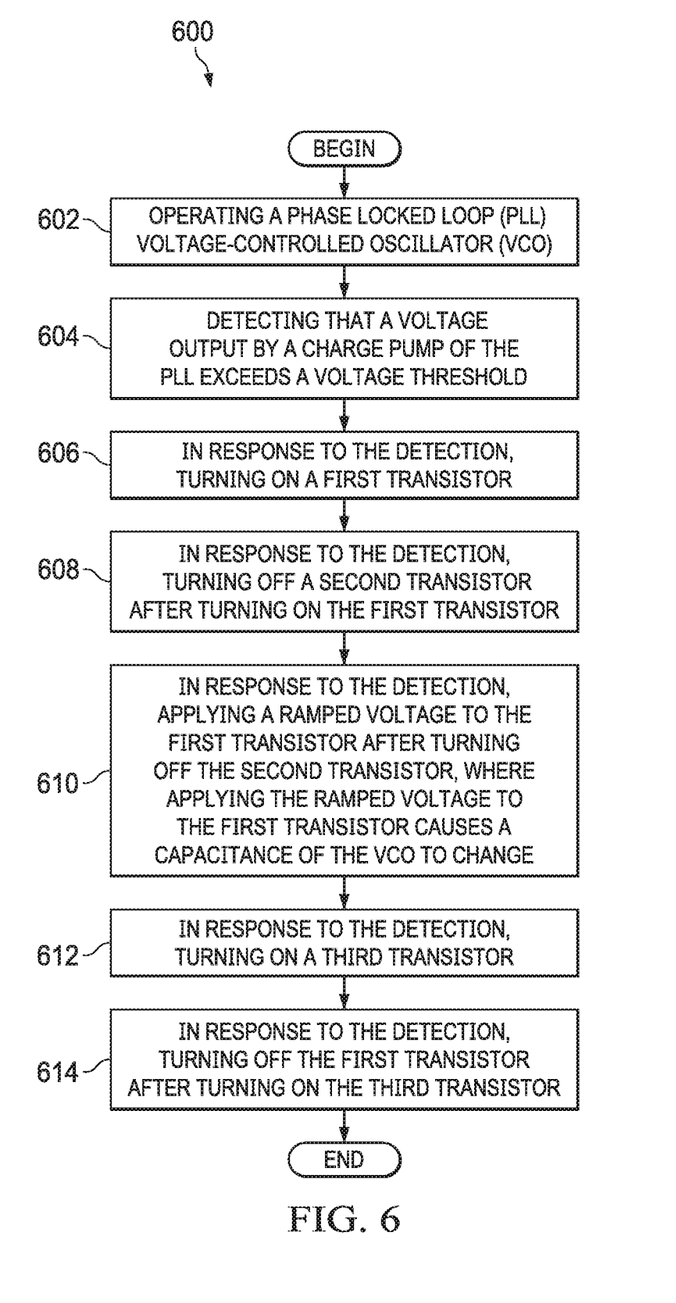
FIG. 6 is a flow diagram of an illustrative method of operation of the PLL system of FIG. 1a, in accordance with examples.

FIG. 6 is a flow diagram of an illustrative method of operation 600 of the PLL system 100 of FIG. 1a, in accordance with examples. The method 600 comprises operating the VCO 110 of the PLL system 100 (step 602). The method 600 next comprises detecting that $V_{ctrl}$ exceeds a voltage threshold (e.g., voltage thresholds $V_{hi}$ and $V_{lo}$) (step 604). The method 600 subsequently includes, in response to the detection, turning on a first transistor (e.g., switch 152) (step 606). The method 600 then includes, in response to the detection, turning off a second transistor (e.g., switch 150 or switch 154) after turning on the first transistor (step 608). The method 600 then includes, in response to the detection, applying a ramped voltage (e.g., EN) to the first transistor after turning off the second transistor, where applying the ramped voltage to the first transistor causes a capacitance of the VCO to change (step 610). The method 600 then comprises, in response to the detection, turning on a third transistor (e.g., switch 154 or switch 150) (step 612). The method 600 then includes, in response to the detection, turning off the first transistor after turning on the third transistor (step 614). The steps of the method 600 can be performed in any suitable order, and the method 600 may be modified by adding, deleting, modifying, or rearranging individual steps.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A voltage-controlled oscillator (VCO), comprising:
an inductor;
a first pair of transistors having first terminals coupled to a voltage source, second terminals coupled to opposing ends of the inductor, and control terminals coupled to opposing ends of the inductor;
a second pair of transistors having first terminals coupled to ground, second terminals coupled to opposing ends of the inductor, and control terminals coupled to opposing ends of the inductor;
a first transistor coupled to at least one capacitor, the combination of the first transistor and the at least one capacitor coupled to the inductor in parallel;
a second transistor wherein a source of the second transistor is directly coupled to a gate of the first transistor, and a drain of the second transistor is directly coupled to a voltage source;
a third transistor wherein a source of the third transistor is directly coupled to the gate of the first transistor, and a drain of the third transistor is configured to receive a ramped voltage; and
a fourth transistor wherein a source of the fourth transistor is directly coupled to the gate of the first transistor, and a drain of the second transistor is directly coupled to ground.

2. The VCO of claim 1, wherein the at least one capacitor comprises multiple capacitors, at least one of the multiple capacitors coupled to a drain terminal of the first transistor and another at least one of the multiple capacitors coupled to a source terminal of the first transistor.

3. The VCO of claim 1, further comprising:
a fifth transistor coupled to another at least one capacitor, the combination of the fifth transistor and the another at least one capacitor coupled to the inductor in parallel; and
sixth, seventh, and eighth transistors coupled to a control terminal of the fifth transistor, the sixth transistor coupled to the voltage source, the eighth transistor coupled to ground, and the seventh transistor configured to receive the ramped voltage.

4. The VCO of claim 1, further comprising a coarse capacitor bank coupled in parallel to the inductor.

5. A phase locked loop (PLL) system, comprising:
a phase-frequency detector (PFD);
a charge pump coupled to the PFD;
first and second comparators, each of the first and second comparators having inputs coupled to an output of the charge pump and configured to receive first and second reference voltages, respectively;
a digital controller coupled to outputs of the first and second comparators; and
a voltage-controlled oscillator (VCO) coupled to the output of the charge pump, the VCO including:
an inductor;
a first pair of transistors coupled to a voltage source and to the inductor;
a second pair of transistors coupled to ground and to the inductor;
a first transistor coupled to a capacitor, the combination of the first transistor and the capacitor coupled in parallel with the inductor, the first transistor having a control terminal;
a second transistor wherein a source of the second transistor is directly coupled to a gate of the first transistor, and a drain of the second transistor is directly coupled to a voltage source;
a third transistor wherein a source of the third transistor is directly coupled to the gate of the first transistor, and a drain of the third transistor is configured to receive a ramped voltage;
a fourth transistor wherein a source of the fourth transistor is directly coupled to the gate of the first transistor, and a drain of the second transistor is directly coupled to ground; and
a coarse capacitor bank coupled to the inductor in parallel.

6. The PLL system of claim 5, wherein, in response to the output of the first comparator being in a predetermined state, the digital controller is configured to:
increment a first digital output of the digital controller;
after the first digital output has been incremented, decrement a second digital output of the digital controller;
after the second digital output has been decremented, drive a third digital output high;
after the third digital output is driven high, increment a fourth digital output; and
after the fourth digital output is incremented, decrement the first digital output.

7. The PLL system of claim 6, wherein the first digital output is configured to control the third transistor.

8. The PLL system of claim 6, wherein the second digital output is configured to control the fourth transistor.

9. The PLL system of claim 6, wherein the third digital output is provided to the third transistor.

10. The PLL system of claim 6, wherein the fourth digital output is configured to control the second transistor.

11. The PLL system of claim 5, wherein, in response to the output of the second comparator being in a predetermined state, the digital controller is configured to:
increment a first digital output of the digital controller;
after the first digital output has been incremented, decrement a second digital output of the digital controller;
after the second digital output has been decremented, drive a third digital output low;
after the third digital output is driven low, increment a fourth digital output; and
after the fourth digital output is incremented, decrement the first digital output.

12. The PLL system of claim 11, wherein:
the first digital output is configured to control the third transistor;
the second digital output is configured to control the second transistor;
the third digital output is provided to the third transistor; and
the fourth digital output is configured to control the fourth transistor.

* * * * *